(12) United States Patent
Arai et al.

(10) Patent No.: US 9,341,651 B2
(45) Date of Patent: May 17, 2016

(54) PROBE CARD AND METHOD FOR MANUFACTURING THE SAME

(71) Applicant: Kabushiki Kaisha Nihon Micronics, Tokyo (JP)

(72) Inventors: Osamu Arai, Tochigi (JP); Yuki Saito, Saitama (JP); Tatsuo Inoue, Tokyo (JP); Hidehiro Kiyofuji, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 187 days.

(21) Appl. No.: 14/285,161

(22) Filed: May 22, 2014

(65) Prior Publication Data

US 2014/0368229 A1    Dec. 18, 2014

(30) Foreign Application Priority Data

Jun. 12, 2013    (JP) .................................. 2013-123737

(51) Int. Cl.
| | |
|---|---|
| *G01R 31/00* | (2006.01) |
| *G01R 1/073* | (2006.01) |
| *G01B 21/08* | (2006.01) |
| *G01R 3/00* | (2006.01) |
| *G01R 31/28* | (2006.01) |

(52) U.S. Cl.
CPC ............ *G01R 1/07314* (2013.01); *G01B 21/08* (2013.01); *G01R 3/00* (2013.01); *G01R 31/2874* (2013.01)

(58) Field of Classification Search
CPC ........ G01R 31/2874; G01R 1/07314–1/07328; G01B 21/08
USPC .......................... 324/755.01–755.11, 756.03, 324/754.01–754.3, 762.01–762.1
See application file for complete search history.

(56) References Cited

U.S. PATENT DOCUMENTS

| | | | | |
|---|---|---|---|---|
| 7,285,968 | B2 * | 10/2007 | Eldridge ............ | G01R 31/2863 324/750.03 |
| 7,795,892 | B2 * | 9/2010 | Yamada ............. | G01R 1/07378 324/756.03 |
| 2005/0001637 | A1 * | 1/2005 | Kazama ............. | G01R 1/07314 324/756.01 |

(Continued)

FOREIGN PATENT DOCUMENTS

| | | |
|---|---|---|
| JP | 2010-151740 | 7/2010 |
| JP | 2010-243352 | 10/2010 |
| JP | 2011-089891 | 5/2011 |

*Primary Examiner* — Patrick Assouad
*Assistant Examiner* — Demetrius Pretlow
(74) *Attorney, Agent, or Firm* — Ingrassia Fisher & Lorenz, P.C.

(57) ABSTRACT

A probe card for an electric test of a device under test on a working table incorporating a heat source includes a circuit base plate including conductive paths connected to a tester, a probe base plate including conductive paths corresponding to the conductive paths and provided with probes connected to the conductive paths, and a heat expansion adjusting member bonded to the probe base plate, having a different linear expansion coefficient from that of the probe base plate to restrain heat expansion of the probe base plate, and constituting a composite body with the probe base plate. In a case where, when the device under test is at two measuring temperatures, the composite body is at corresponding achieving temperatures, expansion changing amounts of the device under test and the composite body under temperature differences between the respective measuring temperatures and the corresponding achieving temperatures are set to be approximately equal.

9 Claims, 4 Drawing Sheets

(56) References Cited

U.S. PATENT DOCUMENTS

| | | | |
|---|---|---|---|
| 2008/0048698 A1* | 2/2008 | Amemiya | G01R 1/07342 324/750.22 |
| 2008/0186040 A1* | 8/2008 | Hobbs | G01R 31/2863 324/750.28 |
| 2009/0160469 A1* | 6/2009 | Miura | G01R 31/2889 324/756.03 |
| 2009/0212800 A1* | 8/2009 | Kiyofuji | G01R 1/07307 324/754.03 |
| 2011/0043232 A1* | 2/2011 | Takase | G01R 1/07342 324/755.01 |

* cited by examiner

PROBE CARD AND METHOD FOR MANUFACTURING THE SAME

RELATED APPLICATION

This application claims the benefit of, and claims priority to, Japanese patent application number 2013-123737, filed on Jun. 12, 2013.

TECHNICAL FIELD

The subject matter relates to a probe card for use in an electric test of a device under test and a method for manufacturing the same.

BACKGROUND

In general, multiple semiconductor integrated circuits formed on a semiconductor wafer undergo an electric test before being separated into respective chips to determine whether or not they are manufactured in accordance with the specification. In this electric test, a probe assembly such as a probe card provided with a plurality of probes to be connected to electrodes of the respective semiconductor integrated circuits on the semiconductor wafer as a device under test is used (for example, refer to Patent Literature 1). The semiconductor wafer is connected to a tester via this probe card as the electrodes of the respective semiconductor integrated circuits are connected to the corresponding probes of the probe card.

More specifically, such a test is performed under a certain measuring temperature in accordance with a use environment of the integrated circuits. Accordingly, in the conventional probe assembly, a chuck as a working table on which the semiconductor wafer is held is provided with a heat source and is heated by heating of the heat source, for example, and a probe base plate is heated along with heating of the chuck.

When the chuck is held at the certain measuring temperature, the semiconductor wafer on the chuck is also held around an approximate temperature to that of the chuck. However, the probe base plate of the probe card is located over the semiconductor wafer as the device under test and is basically heated by radiation heat from the chuck. Hence, even when the temperature of the probe base plate reaches a stable achieving temperature (saturated temperature), the temperature of the semiconductor wafer reaching the desired measuring temperature and the aforementioned achieving temperature of the probe base plate are not equal and have a temperature difference therebetween, and the latter is lower than the former.

This temperature difference causes an expansion difference exceeding a tolerance between an expansion amount of the device under test when the temperature reaches the measuring temperature from a room temperature and an expansion amount of the probe base plate when the temperature reaches the achieving temperature from the room temperature even when the probe base plate having an equal linear expansion coefficient to that of the semiconductor wafer as the device under test is used. The expansion difference exceeding the tolerance brings about a connection failure between the corresponding probes and electrodes. Under such circumstances, to reduce the expansion difference caused by the temperature difference between the measuring temperature of the device under test and the achieving temperature of the probe base plate, the probe base plate having a larger linear expansion coefficient than that of the device under test is normally used for the purpose of compensating the aforementioned temperature difference. Under such conditions, the respective probes are provided on the probe base plate so that the probes may be located at positions of electrode pads of the device under test which is at the measuring temperature when the temperature of the probe base plate reaches the achieving temperature.

Accordingly, as long as the probe card set for the certain measuring temperature is used at the set measuring temperature, the electrodes of the device under test and the corresponding probes of the probe card can be connected at the measuring temperature within the tolerance, and thus an appropriate electric test can be performed.

However, even a semiconductor wafer having formed thereon semiconductor integrated circuits to be manufactured in an equal standard requires a test under a different measuring temperature from the aforementioned certain measuring temperature in some cases due to a difference in use environment of the semiconductor integrated circuits.

In such a case, even when the device under test is to be tested at the different measuring temperature with use of the probe card set for the certain measuring temperature, the set measuring temperature is different from the different measuring temperature, and thus a difference between each probe position of the probe base plate and each electrode position of the device under test exceeds a range of the tolerance in some cases.

Accordingly, in a conventional case, a probe card in which probe positions are set in accordance with a measuring temperature needs to be prepared per measuring temperature even for a semiconductor wafer having formed thereon semiconductor integrated circuits to be manufactured in an equal standard.

Meanwhile, providing the probe base plate with a controllable heat source in addition to the heat source provided in the chuck can be thought (for example, refer to Patent Literature 1 and 2). According to this thought, since the temperature of the device under test and the temperature of the probe base plate can be controlled individually so that the probes of the probe base plate and the corresponding electrodes of the device under test that are under the desired measuring temperature may be located within the tolerance, it is possible to test the same device under test at two different measuring temperatures with use of one probe card.

However, in this case, since the heat source adapted to keep the temperature uniformly over the entire area needs to be arranged in the probe base plate provided with wiring circuits, complication of a structure of the probe base plate is inevitable.

CITATION LIST

Patent Literature

PTL1: Japanese National Patent Appln. Public Disclosure No. 2010-151740

PTL2: Japanese National Patent Appln. Public Disclosure No. 2010-243352

SUMMARY

A probe card is provided which enables an appropriate electric test at two measuring temperatures with use of one probe card without incorporating a heat source in a probe base plate.

A probe card according to an embodiment is a probe card connecting electrodes to a tester for an electric test of a device under test arranged on a working table incorporating a heat source for heating or cooling the device under test having the electrodes and includes a circuit base plate arranged over the working table with a first surface thereof opposed to the working table and provided with conductive paths connected to the tester, a probe base plate held to the circuit base plate with a first surface thereof opposed to the first surface of the circuit base plate and provided with conductive paths corresponding to the conductive paths, a plurality of probes provided on a second surface of the probe base plate, connected to the corresponding conductive paths of the probe base plate, and enabling to contact the respective corresponding electrodes of the device under test on the working table, and a heat expansion adjusting member bonded to the probe base plate, having a different linear expansion coefficient from a linear expansion coefficient of the probe base plate so as to restrain heat expansion of the probe base plate, and constituting a composite body with the probe base plate. In a case where, when the device under test is at two measuring temperatures (T1, T'1), the composite body is at corresponding achieving temperatures (T2, T'2), expansion changing amounts of the device under test and the composite body under temperature differences (T1−T2, T'1−T'2) between the respective measuring temperatures and the corresponding achieving temperatures are set to be approximately equal.

In the probe card according to the embodiment, to the probe base plate provided with the probes is bonded the heat expansion adjusting member having a different linear expansion coefficient from that of the probe base plate, thus to form the composite body by the probe base plate and the heat expansion adjusting member. A graph in FIG. 1 illustrates a typical characteristic line A representing a linear expansion coefficient ($\alpha 4$) of this composite body and a typical characteristic line B representing a linear expansion coefficient ($\alpha 1$) of the device under test. A horizontal axis represents a temperature (° C.) while a vertical axis represents an expansion amount of the composite body and the device under test. RT on the horizontal axis represents a room temperature.

FIG. 1 illustrates an example in which the achieving temperature of the composite body is T2 when the device under test is at the high-temperature-side measuring temperature T1, and in which the achieving temperature of the composite body is T'2 when the device under test is at the low-temperature-side measuring temperature T'1. According to the respective characteristic lines A and B, expansion changing amounts L1 from the room temperature RT when the device under test is at the measuring temperature T1, and when the composite body is at the achieving temperature T2, are equal. This is expressed by the following equation.

$$\alpha 1 \times (T1-RT) = \alpha 4 \times (T2-RT) \qquad \text{(Equation 1)}$$

Also, expansion changing amounts L2 from the room temperature RT when the device under test is at the measuring temperature T'1, and when the composite body is at the achieving temperature T'2, are equal. This is expressed by the following equation.

$$\alpha 2 \times (T'1-RT) = \alpha 4 \times (T'2-RT) \qquad \text{(Equation 2)}$$

Accordingly, this means that, when the characteristic line A representing the linear expansion coefficient ($\alpha 4$) of the composite body and the typical characteristic line B representing the linear expansion coefficient ($\alpha 1$) of the device under test are in such relationship as illustrated in the graph in FIG. 1 from the relationship between the measuring temperatures (T1, T'1) of the device under test and the achieving temperatures (T2, T'2) of the composite body, that is, in relationship satisfying the above (Equation 1) and (Equation 2), misalignment does not occur between pad positions of the device under test and probe positions of the probe base plate at each measuring temperature.

In a case where a probe base plate exhibiting the linear expansion coefficient $\alpha 4$ of the aforementioned composite body can be adopted, the relationship illustrated in the graph in FIG. 1 can be satisfied with the single probe base plate having the appropriate linear expansion coefficient without using the aforementioned heat expansion adjusting member, that is, without constituting the aforementioned composite body.

However, when chemical resistance, heat resistance, mechanical strength characteristics, and the like in a manufacturing process with use of a photolithographic method such as wiring path formation required for the probe base plate are taken into consideration, a base material that can be used for the probe base plate is limited, and it is extremely difficult to obtain a single probe base plate having the appropriate linear expansion coefficient.

In the probe card according to the embodiment, the composite body including the probe base plate and the heat expansion adjusting member bonded to the probe base plate is constituted. Since this heat expansion adjusting member requires no wiring paths, selection of the heat expansion adjusting member is not so heavily limited as in the manufacturing process for the probe base plate. Hence, since selection of the heat expansion adjusting member has a higher degree of freedom than selection of the probe base plate, a linear expansion coefficient of the composite body can be set to a desired value relatively easily by selection of the heat expansion adjusting member.

Accordingly, with the probe card according to the embodiment, since the expansion changing amounts (L1, L2) of the device under test and the composite body under the temperature differences (T1−2, T'1−T2) between the respective measuring temperatures and the corresponding achieving temperatures can be approximately equal, heat expansion differences (L1, L2) between the device under test and the composite body or the probe base plate at the two measuring temperatures (T1, T'1) can be set within tolerances regardless of the temperature differences (T1−T2, T'1−T'2) between the measuring temperatures of the device under test and the achieving temperatures of the probe base plate. Meanwhile, it is apparent that the respective heat expansion differences (L1, L2) at the two respective measuring temperatures (T1, T'1) do not need to be equal to each other.

The first surface of the probe base plate can be arranged to be spaced from the circuit base plate, and in this case, the heat expansion adjusting member can be a plate member bonded to the first surface of the probe base plate.

The probe card according to the embodiment can further include between the circuit base plate and the probe base plate an electric connector adapted to connect the conductive paths of the circuit base plate to the corresponding conductive paths of the probe base plate. In this case, the heat expansion adjusting member can be provided with a hole allowing the electric connector to pass therethrough without having conductive paths.

In the heat expansion adjusting member as the plate member can be formed at least one hole penetrating the plate member in a plate thickness direction to reduce heat capacity of the heat expansion adjusting member. Reduction in heat capacity of the heat expansion adjusting member is extremely efficient to reduce a period required until the temperature of the composite body reaches the achieving temperatures as saturated temperatures. Also, to reduce a heat quantity, the plate member is preferably made of a porous material.

The plate member can be an annular member covering an edge portion of the probe base plate, and the annular member defines in an inside thereof the single hole allowing the electric connector to pass therethrough.

The plate member can be provided with a plurality of holes including the hole penetrating the plate member in the plate thickness direction. The holes can each be formed in a rectangular, circular, or hexagonal flat shape and can be arranged to be arrayed.

The plate member can include a center portion, an annular rim portion surrounding the center portion, and a spoke portion combining the rim portion with the center portion. By the center portion, the rim portion, and the spoke portion, a plurality of holes including the hole penetrating the plate member in the plate thickness direction can be formed among the respective portions.

The heat expansion adjusting member can be bonded to the probe base plate with use of at least one selected means out of a mechanical bonding means, an adhesive, metal eutectic bonding, anodic bonding utilizing covalent bonding, and room temperature bonding utilizing an atomic force of a surface atom.

The probe base plate can include a plate-like supporting member provided with conductive paths to be connected to the conductive paths of the circuit base plate in a multilayered manner and a flexible film fixed at a first surface thereof on a first surface of the supporting member, provided on a second surface thereof with the probes, and provided with conductive paths connecting the conductive paths of the supporting member to the probes corresponding to the conductive paths. In this case, the heat expansion adjusting member is bonded to a second surface of the supporting member and has a different linear expansion coefficient from that of the supporting member.

A manufacturing method according to an embodiment is a method for manufacturing the probe card according to the embodiment and includes determining a thickness dimension $t2$ of the probe base plate by Equation (1) when the device under test has a plane area $S1$, a thickness dimension $t1$, specific gravity $\rho1$, and specific heat $c1$, and when the probe base plate has a plane area $S2$, specific gravity $\rho2$, and specific heat $c2$, and $$t2 = c1 \times \rho1 \times t1 \times S1 / (c2 \times \rho2 \times S2) \quad (1)$$

determining a thickness dimension $t3$ of the heat expansion adjusting member from Equation (2) expressing a linear expansion coefficient $\alpha4$ of the composite body of the probe base plate and the heat expansion adjusting member when the probe base plate has a linear expansion coefficient $\alpha2$ and a volume $V2$ ($S2 \times t2$), when the heat expansion adjusting member has a linear expansion coefficient $\alpha3$, a plane area $S3$, and a thickness dimension $t3$, and when $S2=S3$, $$\begin{aligned}\alpha4 &= (V2 \times \alpha2 + V3 \times \alpha3)/(V2 + V3) \quad (2) \\ &= (S2 \times t2 \times \alpha2 + S2 \times t3 \times \alpha3)/(S2 \times t2 + S2 \times t3) \\ &= (t2 \times \alpha2 + t3 \times \alpha3)/(t2 + t3)\end{aligned}$$

Equations (3) and (4) expressing that expansion changing amounts of the device under test and the composite body at two measuring temperatures ($T1$, $T'1$) of the device under test and corresponding achieving temperatures ($T2$, $T'2$) of the composite body are equal, and $$(T1-RT) \times \alpha1 = (T2-RT) \times \alpha4 \quad (3)$$

$$(RT-T'1) \times \alpha1 = (RT-T'2) \times \alpha4 \quad (4)$$

where RT represents a room temperature, and $\alpha1$ represents a linear expansion coefficient of the device under test Equation (5) derived with use of the Equation (2)

$$t3 = \{(T'2-T2) \times \alpha2 - (T'1-T1) \times \alpha1\} / \{(T'1-T1) \times \alpha1 - (T'2-T2) \times \alpha3\} \times t2 \quad (5).$$

With the method according to the embodiment, by the above procedures, the linear expansion coefficient $\alpha4$ of the composite body can be determined, and the thickness $t3$ of the heat expansion adjusting member constituting the composite body together with the probe base plate can be determined. By doing so, the probe card according to the embodiment can be manufactured easily.

With the probe card and the method for manufacturing the same according to the embodiments, heat expansion differences between the device under test and the probe base plate at the two measuring temperatures can be set within tolerances regardless of the temperature differences between the measuring temperatures of the device under test and the achieving temperatures of the probe base plate as described above. Accordingly, a test can be performed at the two measuring temperatures without incorporating a heat source in the probe base plate.

DETAILED DESCRIPTION

Figure 2:
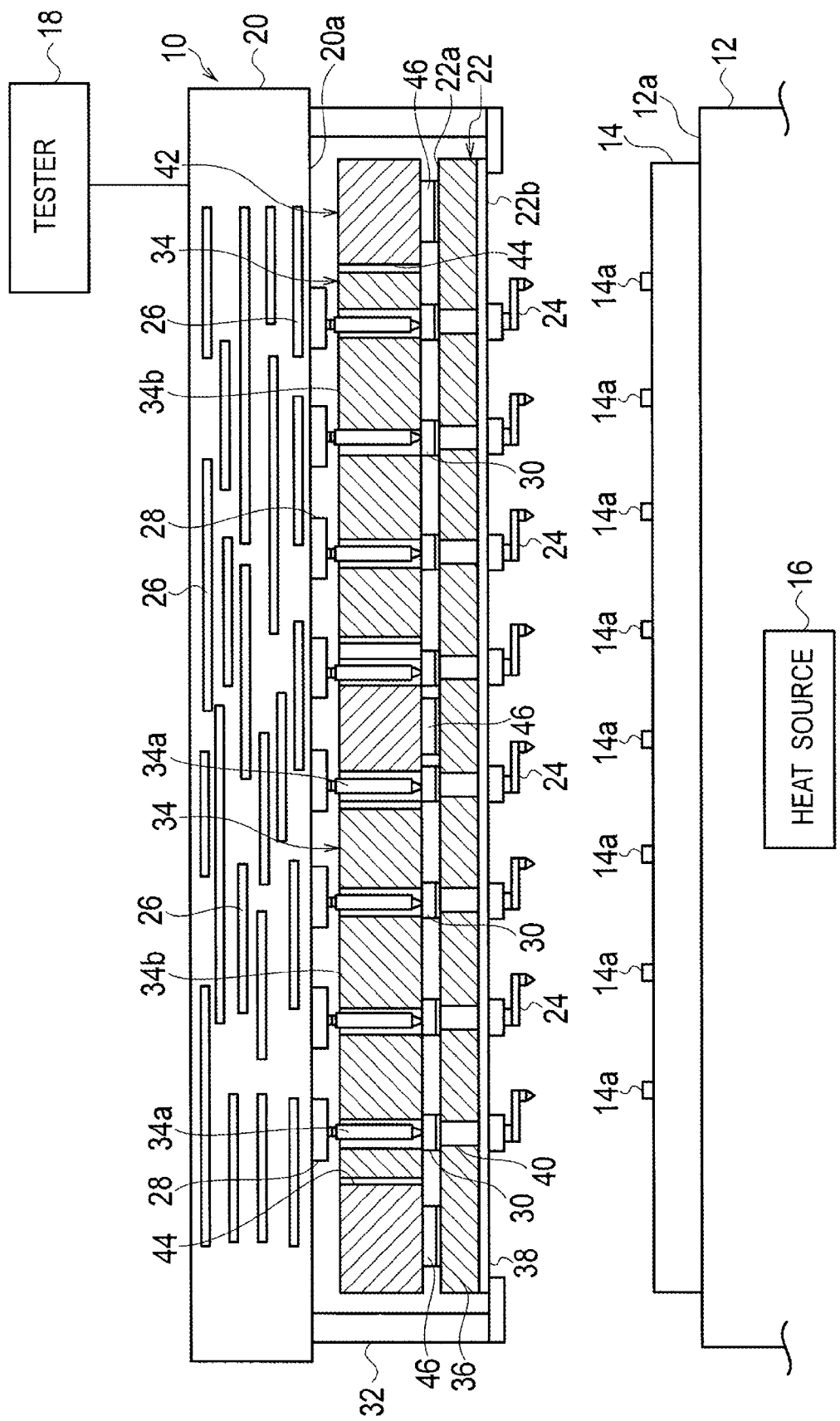
FIG. 2 is a cross-sectional view schematically illustrating an electric connecting apparatus including an embodiment of a probe card.

An electric connecting apparatus or a probe card 10 is used in an electric test of a plurality of semiconductor integrated circuits (not illustrated) formed on a semiconductor wafer 14 arranged on a working table 12 such as a chuck as illustrated in FIG. 2. On an upper surface of the semiconductor wafer 14 as a device under test are formed multiple electrodes 14a connected to the semiconductor integrated circuits, and the semiconductor wafer 14 is arranged to abut at a lower surface thereof on a working surface 12a of the working table 12.

In the working table 12 is arranged any one not-illustrated conventionally-well-known heat source 16 out of a heat source for cooling such as a Peltier element, a heat source for heating such as a heater, and a combined heat source as a combination thereof. The heat source 16 is operated under control of a not-illustrated conventionally-well-known control circuit so as to keep the device under test 14 on the working table 12 at desired measuring temperatures ($T1$, $T'1$) and keep the probe card 10 at achieving temperatures ($T2$, $T'2$) as saturated temperatures corresponding to the measuring temperatures as described below.

The probe card 10 is held in a conventionally-well-known test head (not illustrated) over the working table 12 to connect a tester 18 for use in an electric test of the device under test 14 to the respective electrodes 14a of the device under test 14 on the working table 12.

The probe card 10 includes a circular wiring base plate 20 held in the test head with a lower surface 20a thereof opposed to the working surface 12a of the working table 12 so as to be spaced from the device under test 14 on the working table 12, a circular probe base plate 22 arranged with an upper surface 22a thereof opposed to the lower surface 20a of the wiring base plate 20, and multiple probes 24 as connection pads arranged on a lower surface 22b of the probe base plate 22. For each of the probes 24, a so-to-speak cantilever-type probe is used in the example illustrated in the figure.

The wiring base plate 20 is a conventionally-well-known multilayered wiring base plate using as a base material a rigid electric insulating resin material such as a glass-containing epoxy resin and incorporating multiple conductive paths 26 in a multilayered manner as needed. The lower surface 20a of the wiring base plate 20 is provided with connection pads 28 connected to the corresponding conductive paths 26.

The upper surface 22a of the probe base plate 22 is provided with connection pads 30 corresponding to the connection pads 28 of the wiring base plate 20. In the example illustrated in the figure, the probe base plate 22 is supported to the wiring base plate 20 by an annular holder 32 so that the upper surface 22a thereof may be spaced from the lower surface 20a of the wiring base plate 20. Also, between the probe base plate 22 and the wiring base plate 20 are arranged, e.g., POGO pin connectors 34, for connection between the corresponding connection pads 28 and 30.

In the example illustrated in FIG. 2, the probe base plate 22 has a laminated structure including a plate-like supporting member 36 made of a rigid insulating material such as a ceramic and a conventionally-well-known multilayered wiring film 38 fixed on a lower surface of the supporting member 36. On an upper surface of the supporting member 36 as the upper surface 22a of the probe base plate 22 are provided the connection pads 30, and the supporting member 36 is provided with conductive paths 40 reaching a lower surface of the supporting member 36 from the corresponding connection pads 30. Each of the conductive paths 40 is a through hole filled with a conductive material such as Cu, Ag, Mo, and W, as is conventionally well known.

The multilayered wiring film 38 is provided with conductive paths (not illustrated) corresponding to the conductive paths 40 of the supporting member 36. On a lower surface of the multilayered wiring film 38 as the lower surface 22b of the probe base plate 22 provided with the probes 24 are arranged the probes 24 to correspond to the electrodes 14a of the device under test 14. Thus, each probe 24 is connected via the conductive path in the multilayered wiring film 38 and the conductive path 40 in the supporting member 36 to the corresponding connection pad 30 of the probe base plate 22.

In the probe base plate 22 having the aforementioned laminated structure, heat expansion of the probe base plate 22 is under control of expansion of the supporting member 36, and a linear expansion coefficient of the probe base plate 22 can be regarded as a linear expansion coefficient of the supporting member 36. The probe base plate 22 can have a single-layered structure instead of the laminated structure.

Each of the POGO pin connectors 34 includes POGO pins 34a mutually connecting the corresponding connection pads 28 and 30 of the probe base plate 22 and the wiring base plate 20 and a conventionally-well-known POGO pin block 34b holding the respective POGO pins 34a. In the example illustrated in the figure, the POGO pin block 34b is mounted on the connection pads 30.

Since each POGO pin 34a connects the corresponding connection pads 28 and 30 of the probe base plate 22 and the wiring base plate 20, each probe 24 is connected via the conductive path of the multilayered wiring film 38 as described above, the conductive path 40 corresponding to the conductive path as described above, the POGO pin 34a corresponding to the conductive path 40, and the conductive path 26 of the wiring base plate 20 corresponding to the POGO pin 34a to the tester 18.

In a test of the device under test 14, the heat source 16 is operated under control to set the temperature of the device under test 14 on the working table 12 to a predetermined measuring temperature, and the working table 12, for example, is moved so that the wiring base plate 20 and the device under test 14 may approach to each other. By the movement of the working table 12, each probe 24 is connected to the corresponding electrode 14a of the device under test 14. When each probe 24 receives an appropriate pressing force, a test by the tester 18 can be performed.

At this time, the device under test 14 receives, e.g., heat energy, from the heat source 16 on the working surface 12a by heat conduction. Hence, the temperature of the device under test 14 reaches the measuring temperature T1 in a relatively short period. However, the probe base plate 22 is spaced from the working table 12 and just receives radiation heat from the working table 12 and the device under test 14 before each probe 14 is connected to the corresponding electrode 14a of the device under test 14. Also, even in a state in which each probe 14 is connected to the corresponding electrode 14a of the device under test 14, energy transfer by heat conduction via the probes 24 is extremely small.

Thus, even when the heat source 16 is operated under control of the control circuit, and the temperature of the device under test 14 reaches the predetermined measuring temperature T1, the temperature of the probe base plate 22 does not reach the measuring temperature T1 and is saturated at the lower temperature T2 than the measuring temperature T1.

Similarly, even when the heat source 16 is operated under control of the control circuit, and the temperature of the device under test 14 reaches the measuring temperature T'1, which is, e.g., negative temperature, different from the measuring temperature T1, the temperature of the probe base plate 22 does not reach the measuring temperature T'1 and is saturated at the temperature T'2 different from the measuring temperature T'1.

To restrict a heat expansion difference between the device under test 14 and the probe base plate 22 resulting from a temperature difference between the device under test 14 and the probe base plate 22 at each measuring temperature (T1, T'1), a plate-like heat expansion adjusting member 42 is bonded to the probe base plate 22 of the probe card 10.

The heat expansion adjusting member 42 is a plate member having a different linear expansion coefficient from the linear expansion coefficient of the supporting member 36 controlling heat expansion of the probe base plate 22.

For the supporting member 36 of the probe base plate 22, an insulating plate member such as glass, a glass ceramic, and a glass epoxy resin is selectively used instead of the aforementioned ceramic, as is conventionally well known, so that the probe base plate 22 may have a linear expansion coefficient approximate to a linear expansion coefficient of the device under test 14. In relation to the linear expansion coefficient of the probe base plate 22, for the heat expansion adjusting member 42, a plate member having a different linear expansion coefficient from the linear expansion coefficient of the probe base plate 22 or the linear expansion coefficient of the supporting member 36 is selected. As the heat expansion adjusting member 42 is used a plate member having different component rate and composition from those of the supporting member 36 and having a low linear expansion coefficient equal to or lower than 10 ppm/° C. such as glass (3 to 10 ppm/° C.), a glass ceramic (3.5 to 8 ppm/° C.), a ceramic (to 10 ppm/° C.), glass epoxy, a metal, an alloy, wood, a resin, a stone (marble: carbonate), a brick (kaolinite), concrete, and a nanotube material.

Figure 1:
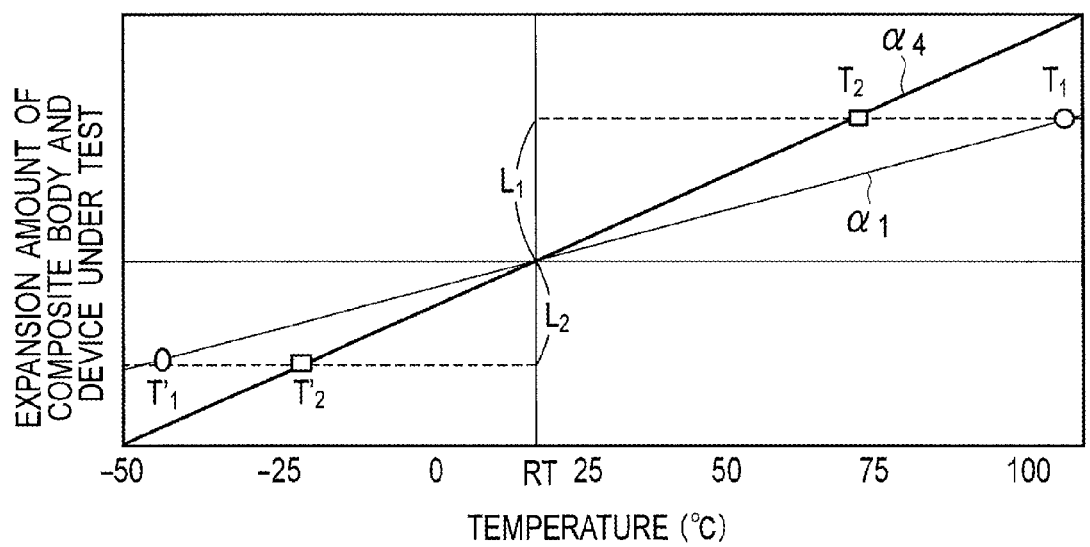
FIG. 1 is a graph illustrating linear expansion coefficients of a composite body and a device under test according to an embodiment, and a horizontal axis represents a temperature while a vertical axis represents an expansion amount of each component.
Figure 3:
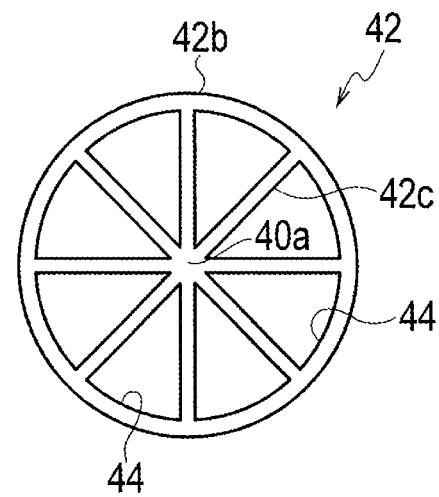
FIG. 3 is a plan view illustrating a heat expansion adjusting member incorporated in the probe card in FIG. 2.

As illustrated in FIG. 3, the heat expansion adjusting member 42 illustrated in FIG. 1 includes a center boss portion 42a, a rim portion 42b concentrically surrounding the center boss portion 42a, and a spoke portion 42c radially extending between the center boss portion 42a and the rim portion 42b so as to combine the center boss portion 42a with the rim portion 42b. Among the respective portions 42a, 42b, and 42c of the heat expansion adjusting member 42 are formed multiple holes 44 penetrating the heat expansion adjusting member 42 in a plate thickness direction. The POGO pin connector 34 is arranged in each hole 44.

The heat expansion adjusting member 42 is bonded via a connecting means 46 with the upper surface 22a of the probe base plate 22 so as to expand integrally with the probe base plate 22 or the supporting member 36 as illustrated in FIG. 2. As the connecting means 46, adhesive bonding, metal eutectic bonding, anodic bonding, or mechanical bonding such as screwing can be arbitrarily selected.

The heat expansion adjusting member 42 according to the embodiment is bonded to the probe base plate 22 to constitute a composite body with the probe base plate 22 and to restrain heat expansion of the probe base plate 22. Thus, by appropriate selection of the linear expansion coefficient of the heat expansion adjusting member 42, the expansion changing amounts of the device under test 14 and the composite body (22, 42) under the temperature differences (T1–T2, T'1–T'2) between the respective measuring temperatures (T1, T'1) and the corresponding achieving temperatures can be approximately equal to satisfy the (Equation 1) and (Equation 2), as described with reference to FIG. 1.

Accordingly, by performing setting so that positions of the probes 24 on the probe base plate 22 may be located on the corresponding electrodes 14a of the device under test 14 at any one measuring temperature of the measuring temperatures (T1, T'1), the probes 24 and the corresponding electrodes 14a at both the measuring temperatures (T1, T'1) can be within a tolerance. A test can be performed at the two measuring temperatures (T1, T'1) without incorporating a heat source in the probe base plate 22 as in a conventional case.

In manufacturing the probe card 10 according to the embodiment, how to derive a linear expansion coefficient α3 of the heat expansion adjusting member 42 and a plate thickness t3 thereof will be described below. For simplicity of description, the multilayered wiring film 38 of the probe base plate 22 is ignored.

To make temperature changes of the probe base plate 22 follow temperature changes of the device under test 14, a heat quantity (specific heat×specific gravity×volume) that raises the temperature of the probe base plate 22 by 1° C. has only to be equal to that of the device under test 14. For example, when the device under test 14 has a plane area S1, a thickness dimension t1, specific gravity ρ1, and specific heat c1, and when the probe base plate 22 (supporting member 36) has a plane area S2, specific gravity ρ2, and specific heat c2, the following equation has only to be satisfied.

$$c1 \times \rho1 \times t1 \times S1 = c2 \times \rho2 \times t2 \times S2$$

Accordingly, from the above equation, a thickness dimension t2 of the probe base plate 22 is derived from the following equation.

$$t2 = c1 \times \rho1 \times t1 \times S1 / (c2 \times \rho2 \times S2) \quad (1)$$

The heat expansion amount of the probe base plate 22 can be adjusted by a material and a structure of the heat expansion adjusting member 42 and a bonding area between the heat expansion adjusting member 42 and the probe base plate 22. When the probe base plate 22 has a linear expansion coefficient α2 and a volume V2 (S2×t2), when the heat expansion adjusting member 42 has the linear expansion coefficient α3, a plane area S3, and a thickness dimension t3, and when S2=S3, the linear expansion coefficient α4 of the composite body (22, 42) of the probe base plate 22 and the heat expansion adjusting member 42 satisfies the following Equation (2).

$$\alpha4 = (V2 \times \alpha2 + V3 \times \alpha3)/(V2 + V3) \quad (2)$$

$$= (S2 \times t2 \times \alpha2 + S2 \times t3 \times \alpha3)/(S2 \times t2 + S2 \times t3)$$

$$= (t2 \times \alpha2 + t3 \times \alpha3)/(t2 + t3)$$

Also, as for the linear expansion coefficient α4 of the composite body including the probe base plate 22 and the heat expansion adjusting member 42, the fact that the expansion changing amounts of the device under test 14 and the composite body (22, 42) at the two measuring temperatures (T1, T'1) of the device under test 14 and the corresponding achieving temperatures (T2, T'2) of the composite body (22, 42) are equal is expressed by the following Equations (3) and (4).

$$(T1-RT) \times \alpha1 = (T2-RT) \times \alpha4 \quad (3)$$

$$(RT-T'1) \times \alpha1 = (RT-T'2) \times \alpha4 \quad (4)$$

In the equations, RT represents a room temperature, and α1 represents a linear expansion coefficient of the device under test.

From the above Equation (3), Equation (4), and Equation (2), the following equation for deriving the linear expansion coefficient α4 of the composite body (22, 42) is derived.

$$\alpha4 = (T1-T'1)/(T'2-T2) \times \alpha1 \quad (4.5)$$

By substituting the Equation (4.5) for the Equation (2), the thickness dimension t3 of the heat expansion adjusting member 42 is determined.

$$t3 = \{(T'2-T2) \times \alpha2 - (T'1-T1) \times \alpha1\}/\{(T'1-T1) \times \alpha1 - (T'2-T2) \times \alpha3\} \times t2 \quad (5)$$

Also, as for the linear expansion coefficient α3 and the plate thickness t3 of the heat expansion adjusting member 42, by repeated calculation of the equation (2), optimal linear expansion coefficient α3 and plate thickness t3 are selected from plate thicknesses t3 and linear expansion coefficients α3 satisfying the equation (2).

The heat expansion adjusting member 42 is preferably made of a porous member. A heat expansion adjusting member 42 made of a porous member enables reduction in heat capacity of the heat expansion adjusting member and heat insulation between the probe base plate 22 and the wiring base plate 20 more than a solid heat expansion adjusting member 42. Thus, since the heat expansion adjusting member 42 made of a porous member can restrict a substantial increase in heat capacity of the probe base plate 22, followability of temperature changes of the probe base plate 22 to temperature changes of the device under test 14 can be enhanced.

Figure 4:
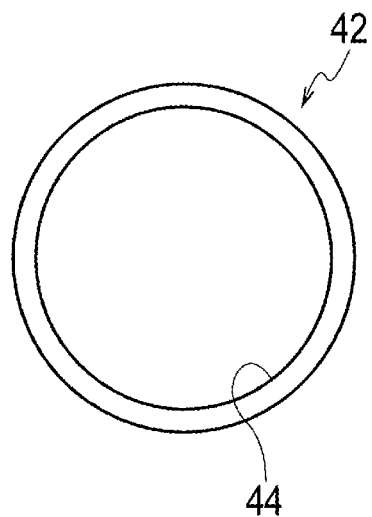
FIG. 4 is a plan view illustrating another example of the heat expansion adjusting member illustrated in FIG. 3.
Figure 5:
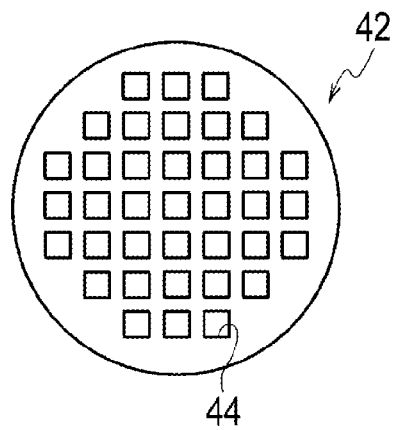
FIG. 5 is a plan view illustrating still another example of the heat expansion adjusting member illustrated in FIG. 3.
Figure 6:
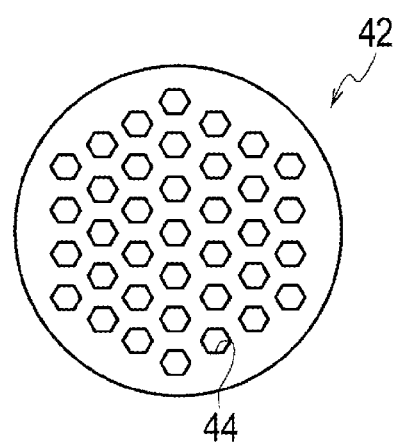
FIG. 6 is a plan view illustrating still another example of the heat expansion adjusting member illustrated in FIG. 3.
Figure 7:
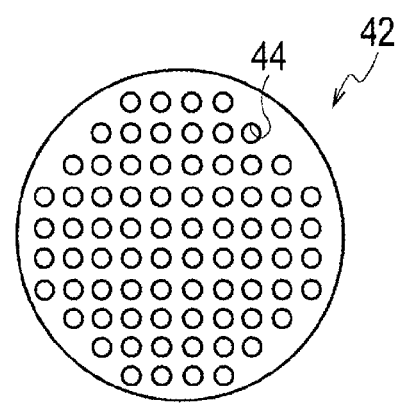
FIG. 7 is a plan view illustrating still another example of the heat expansion adjusting member illustrated in FIG. 3.

As illustrated in FIG. 4, the heat expansion adjusting member 42 can be made of an annular plate member and can be provided inside with the single hole 44 for the connector 34. Also, as illustrated in FIG. 5 to FIG. 7, the hole 44 of the heat expansion adjusting member 42 can be formed in a desired shape such as a rectangular shape such as a square, a hexagonal shape, and a circular shape. By arranging the respective POGO pins 34a of the POGO pin connectors 34 in the respective holes 44 as illustrated in FIG. 5 to FIG. 7, the heat expansion adjusting member 42 can function as a POGO pin block 34b. Thus, in this case, the POGO pin block 34b can be dispensed with.

Also, instead of the POGO pin connectors 34, various conventionally-well-known electric connectors can be applied. Also, the electric connector can be dispensed with, and the connection pads 30 of the probe base plate 22 can abut on the connection pads 28 of the wiring base plate 20 to connect the pads 28 to the pads 30. In this case, the annular heat expansion adjusting member 42 illustrated in FIG. 4 can be bonded to the lower surface of the probe base plate 22.

The described subject matter is not limited to the above embodiments but may be altered in various ways without departing from the spirit and scope presented here. For example, as a probe, a needle-like probe such as a tungsten wire can be used.

What is claimed is:

1. A probe card connecting electrodes to a tester for an electric test of a device under test arranged on a working table incorporating a heat source for heating or cooling the device under test having the electrodes, the probe card comprising:
   a circuit base plate arranged over the working table with a first surface thereof opposed to the working table and provided with conductive paths connected to the tester;
   a probe base plate held to the circuit base plate with a first surface thereof opposed to the first surface of the circuit base plate and provided with conductive paths corresponding to the conductive paths;
   a plurality of probes provided on a second surface of the probe base plate, connected to the corresponding conductive paths of the probe base plate, and enabling to contact the respective corresponding electrodes of the device under test on the working table; and
   a heat expansion adjusting member bonded to the probe base plate, having a different linear expansion coefficient from a linear expansion coefficient of the probe base plate so as to restrain heat expansion of the probe base plate, and constituting a composite body with the probe base plate,
   wherein, in a case where, when the device under test is at two measuring temperatures (T1, T'1), the composite body is at corresponding achieving temperatures (T2, T'2), expansion changing amounts of the device under test and the composite body under temperature differences (T1 - T2, T'1 - T'2) between the respective measuring temperatures and the corresponding achieving temperatures are set to be approximately equal.

2. The probe card according to claim 1, wherein the first surface of the probe base plate is arranged to be spaced from the circuit base plate, and the heat expansion adjusting member is a plate member bonded to the first surface of the probe base plate.

3. The probe card according to claim 2, wherein, between the circuit base plate and the probe base plate is further arranged an electric connector adapted to connect the conductive paths of the circuit base plate to the corresponding conductive paths of the probe base plate, and the heat expansion adjusting member is provided with at least one hole allowing the electric connector to pass therethrough without having conductive paths.

4. The probe card according to claim 3, wherein the at least one hole penetrates the heat expansion adjusting member in a plate thickness direction to reduce heat capacity of the heat expansion adjusting member.

5. The probe card according to claim 4, wherein the plate member is an annular member covering an edge portion of the probe base plate, and the annular member defines in an inside thereof the at least one hole allowing the electric connector to pass therethrough.

6. The probe card according to claim 4, wherein the plate member comprises a plurality of holes penetrating the plate member in the plate thickness direction.

7. The probe card according to claim 4, wherein the plate member includes a center portion, an annular rim portion surrounding the center portion, and a spoke portion combining the rim portion with the center portion, and by the center portion, the rim portion, and the spoke portion, a plurality of holes including the at least one hole penetrating the plate member in the plate thickness direction are formed among the respective portions.

8. The probe card according to claim 1, wherein the heat expansion adjusting member is bonded to the probe base plate with use of at least one selected means out of a mechanical bonding means, an adhesive, metal eutectic bonding, anodic bonding utilizing covalent bonding, and room temperature bonding utilizing an atomic force of a surface atom.

9. The probe card according to claim 1, wherein the probe base plate includes a plate-like supporting member provided with conductive paths to be connected to the conductive paths of the circuit base plate in a multilayered manner and a flexible film fixed at a first surface thereof on a first surface of the supporting member, provided on a second surface thereof with the probes, and provided with conductive paths connecting the conductive paths of the supporting member to the probes corresponding to the conductive paths, and the heat expansion adjusting member is bonded to a second surface of the supporting member and has a different linear expansion coefficient from that of the supporting member.

* * * * *